United States Patent
Wan et al.

(10) Patent No.: US 11,605,241 B2
(45) Date of Patent: Mar. 14, 2023

(54) SENSING DEVICE AND ELECTRONIC DEVICE

(71) Applicant: InnoLux Corporation, Miao-Li County (TW)

(72) Inventors: Wei-Lin Wan, Miao-Li County (TW); Yu-Tsung Liu, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/811,907

(22) Filed: Jul. 12, 2022

(65) Prior Publication Data

US 2023/0051302 A1 Feb. 16, 2023

(30) Foreign Application Priority Data

Aug. 12, 2021 (CN) .......................... 202110924005.3

(51) Int. Cl.
*G06V 40/13* (2022.01)
*G06V 40/40* (2022.01)
*G02B 5/20* (2006.01)
*G06F 3/041* (2006.01)
*H01L 33/46* (2010.01)
(Continued)

(52) U.S. Cl.
CPC ......... *G06V 40/1318* (2022.01); *G02B 5/204* (2013.01); *G06F 3/0412* (2013.01); *G06F 3/0421* (2013.01); *G06V 40/45* (2022.01); *H01L 25/167* (2013.01); *H01L 33/46* (2013.01)

(58) Field of Classification Search
CPC .... G06V 40/1318; G06V 40/45; G02B 5/204; G06F 3/0412; G06F 3/0421; H01L 25/167; H01L 33/46
See application file for complete search history.

(56) References Cited

U.S. PATENT DOCUMENTS

2006/0115128 A1  6/2006  Mainguet
2017/0300738 A1*  10/2017  Li ..................... G06V 40/1318
(Continued)

FOREIGN PATENT DOCUMENTS

CA  2 513 412 A1  8/2004
CN  110580433 A  12/2019
(Continued)

OTHER PUBLICATIONS

Chinese language office action dated Dec. 23, 2022, issued in application No. TW 111111349.
(Continued)

*Primary Examiner* — Jonathan A Boyd
(74) *Attorney, Agent, or Firm* — McClure, Qualey & Rodack, LLP

(57) ABSTRACT

A sensing device includes a substrate, a first circuit, a second circuit, a first photodetector, and a second photodetector. The substrate has a sensing region. The first circuit is disposed on the substrate and in the sensing region, and configured to sense a fingerprint. The second circuit is disposed on the substrate and in the sensing region, and configured to sense a living body. The first photodetector is electrically connected to the first circuit. The second photodetector is electrically connected to the second circuit. The area of the second photodetector is larger than the area of the first photodetector.

20 Claims, 11 Drawing Sheets

(51) Int. Cl.
    *G06F 3/042*     (2006.01)
    *H01L 25/16*     (2023.01)

(56) References Cited

U.S. PATENT DOCUMENTS

| | | | |
|---|---|---|---|
| 2017/0337412 A1* | 11/2017 | Bhat | H04N 5/2256 |
| 2017/0337413 A1* | 11/2017 | Bhat | A61B 5/0075 |
| 2019/0019000 A1 | 1/2019 | Lee et al. | |
| 2019/0034020 A1* | 1/2019 | He | G06V 40/1318 |
| 2019/0180071 A1* | 6/2019 | Kim | G06V 40/1359 |
| 2019/0294852 A1* | 9/2019 | Vogel | G06V 40/1318 |
| 2020/0327302 A1* | 10/2020 | He | G06F 3/0412 |

FOREIGN PATENT DOCUMENTS

| | | |
|---|---|---|
| CN | 112036228 A | 12/2020 |
| CN | 112768493 A | 5/2021 |
| CN | 112860120 A | 5/2021 |
| KR | 10-2019-0100839 A | 8/2019 |

OTHER PUBLICATIONS

Extended European Search Report dated Jan. 10, 2023, issued in application No. EP 22185406.0.

* cited by examiner

SENSING DEVICE AND ELECTRONIC DEVICE

CROSS REFERENCE TO RELATED APPLICATIONS

This application claims priority of China Patent Application No. 202110924005.3, filed on Aug. 12, 2021, the entirety of which is incorporated by reference herein.

BACKGROUND OF THE DISCLOSURE

Field of the Disclosure

The disclosure relates to a sensing device, and in particular, to a sensing device and an electronic device capable of sensing a fingerprint and a living body.

Description of the Related Art

Conventional sensing devices often use optical fingerprint identification technology to identify fingerprints on an object. However, when a sensing device performs a fingerprint identification on an object, the sensing device may not perform a living body fingerprint identification on the object, so that the actual living body anti-counterfeiting identification may not be performed. Therefore, a new design for a circuit structure is needed to solve the problem described above.

BRIEF SUMMARY OF THE DISCLOSURE

An embodiment of the disclosure provides a sensing device, which includes a substrate, a first circuit, a second circuit, a first photodetector and a second photodetector. The substrate has a sensing region. The first circuit is disposed on the substrate and in the sensing region, and configured to sense a fingerprint. The second circuit is disposed on the substrate and in the sensing region, and configured to sense a living body. The first photodetector is electrically connected to the first circuit. The second photodetector is electrically connected to the second circuit. The area of the second photodetector is larger than the area of the first photodetector.

An embodiment of the disclosure provides an electronic device, which includes a display panel and a sensing device. The sensing device is disposed on the side of the display panel, wherein the sensing device includes a substrate, a first circuit, a second circuit, a first photodetector and a second photodetector. The substrate has a sensing region. The first circuit is disposed on the substrate and in the sensing region, and configured to sense a fingerprint. The second circuit is disposed on the substrate and in the sensing region, and configured to sense a living body. The first photodetector is electrically connected to the first circuit. The second photodetector is electrically connected to the second circuit. The area of the second photodetector is larger than the area of the first photodetector.

BRIEF DESCRIPTION OF THE DRAWINGS

The disclosure can be fully understood by reading the subsequent detailed description and examples with references made to the accompanying drawings, wherein.

DETAILED DESCRIPTION OF THE DISCLOSURE

Figure 1:
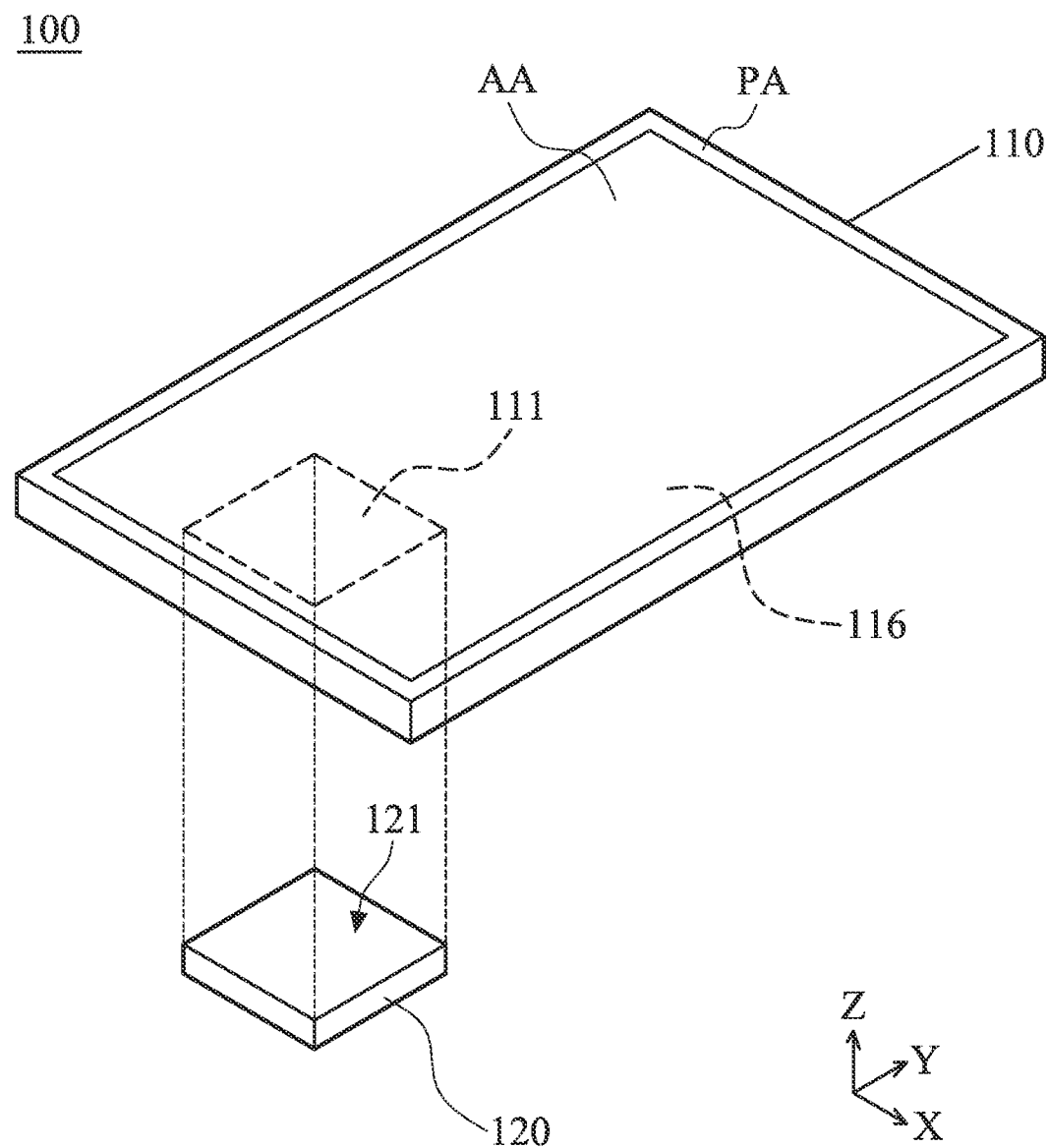
FIG. 1 is a perspective view of an electronic device according to an embodiment of the disclosure.

In order to make objects, features and advantages of the disclosure more obvious and easily understood, the embodiments are described below, and the detailed description is made in conjunction with the drawings. In order to help the reader to understand the drawings, the multiple drawings in the disclosure may depict a part of the entire device, and the specific components in the drawing are not drawn to scale.

The specification of the disclosure provides various embodiments to illustrate the technical features of the various embodiments of the disclosure. The configuration, quantity, and size of each component in the embodiments are for illustrative purposes, and are not intended to limit the disclosure. In addition, if the reference number of a component in the embodiments and the drawings appears repeatedly, it is for the purpose of simplifying the description, and does not mean to imply a relationship between different embodiments.

Furthermore, use of ordinal terms such as "first", "second", etc., in the specification and the claims to describe a claim element does not by itself connote and represent the claim element having any previous ordinal term, and does not represent the order of one claim element over another or the order of the manufacturing method, either. The ordinal terms are used as labels to distinguish one claim element having a certain name from another element having the same name.

In the disclosure, the technical features of the various embodiments may be replaced or combined with each other to complete other embodiments without being mutually exclusive.

The "including" mentioned in the entire specification and claims is an open term, so it should be interpreted as "including or comprising but not limited to".

Furthermore, "connected or "coupled" herein includes any direct and indirect connection means. Therefore, an element or layer is referred to as being "connected to" or "coupled to" another element or layer, the element or layer can be directly on, connected or coupled to another element or layer or intervening elements or layers may be present. When an element is referred to as being "directly connected to" or "directly coupled to" another element or layer, there are no intervening elements or layers present. If the text describes that a first device on a circuit is coupled to a second device, it indicates that the first device may be directly electrically connected to the second device. When the first device is directly electrically connected to the second device, the first device and the second device are connected through conductive lines or passive elements (such as resistors, capacitors, etc.), and no other electronic elements are connected between the first device and the second device.

The directional term mentioned in the text, such as "upper", "lower", "front", "rear", "left", "right", etc., is direction with reference to the drawings. Therefore, the used directional term is used to illustrate, but not to limit the disclosure. In the drawings, each drawing shows the general characteristics of the method, structure and/or material used in a specific embodiment. However, these drawings should not be construed as defining or limiting the scope or nature covered by these embodiments. For example, for the sake of clarity, the relative size, thickness and position of each layer, region and/or structure may be reduced or enlarged.

In the disclosure, the thickness, the length and the width may be measured by using an optical microscope (OM), and the thickness and the length may be measured from a section image in a scanning electron microscope (SEM), but the disclosure is not limited thereto. In addition, there may be a certain error in any two values or directions used for comparison.

It should be understood that although the terms such as "first", "second", etc., may be used herein to describe various elements, components, regions, layers and/or parts, these elements, components, regions, layers and/or parts should not be limited by these terms. These terms are used to distinguish one element, component, region, layer and/or part from another element, component, region, layer and/or part. Therefore, without departing from the teaching of the disclosure, a first element, a first component, a first region, a first layer or a first part discussed below may also be referred to as a second element, a second component, a second region, a second layer or a second part.

Furthermore, phrases such as "within a range of a first value and a second value" or "in a range between a first value and a second value" indicate that the range includes the first value, the second value and other values between the first value and the second value.

The terms "about", "equal to", "equal" or "the same", or "substantially" or "approximately" usually represent within 20% of a given value or range, or represent within 10%, 5%, 3%, 2%, 1% or 0.5% of the given value or range.

Figure 2:
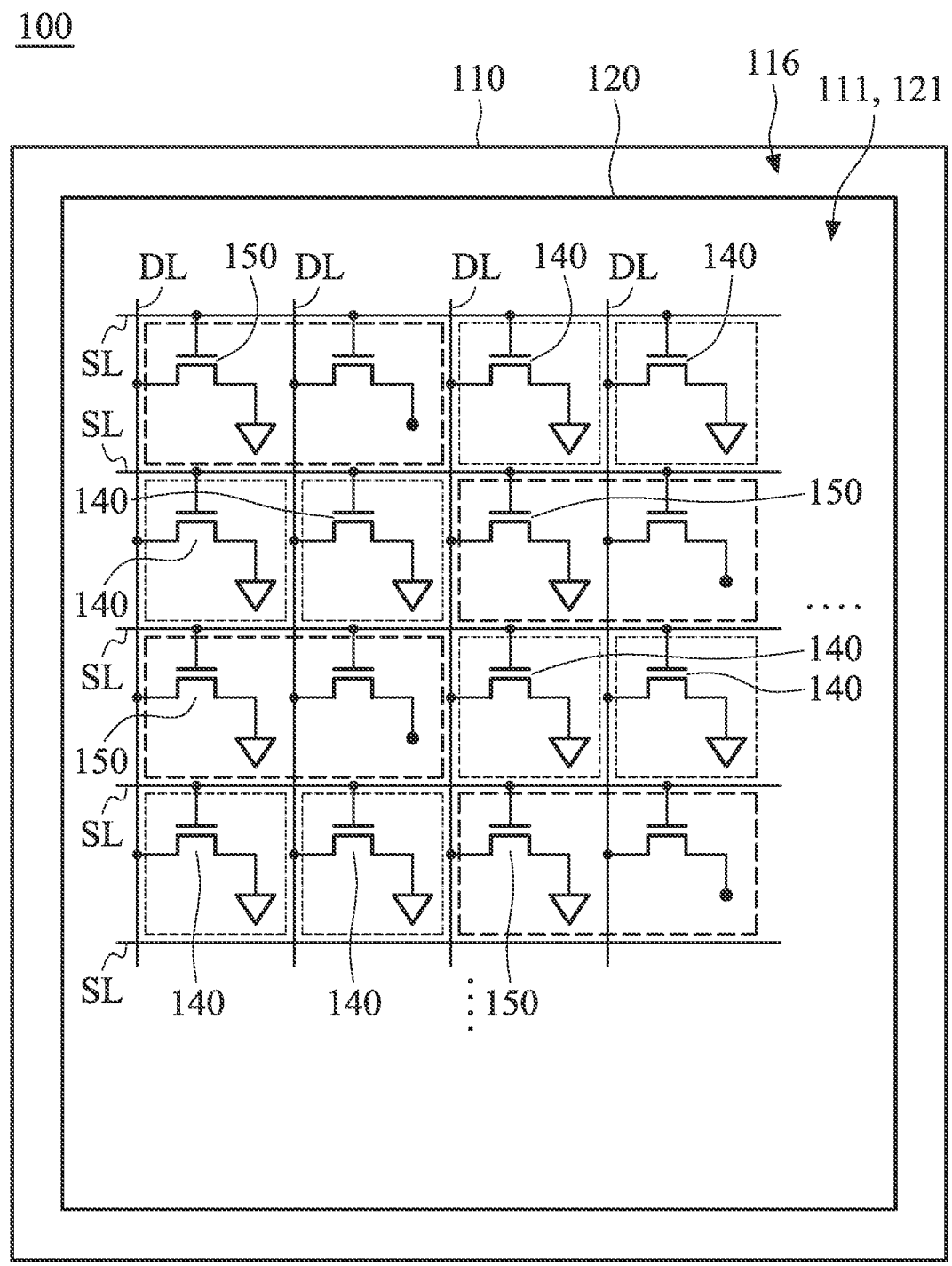
FIG. 2 is a top view of an electronic device according to an embodiment of the disclosure.
Figure 3:
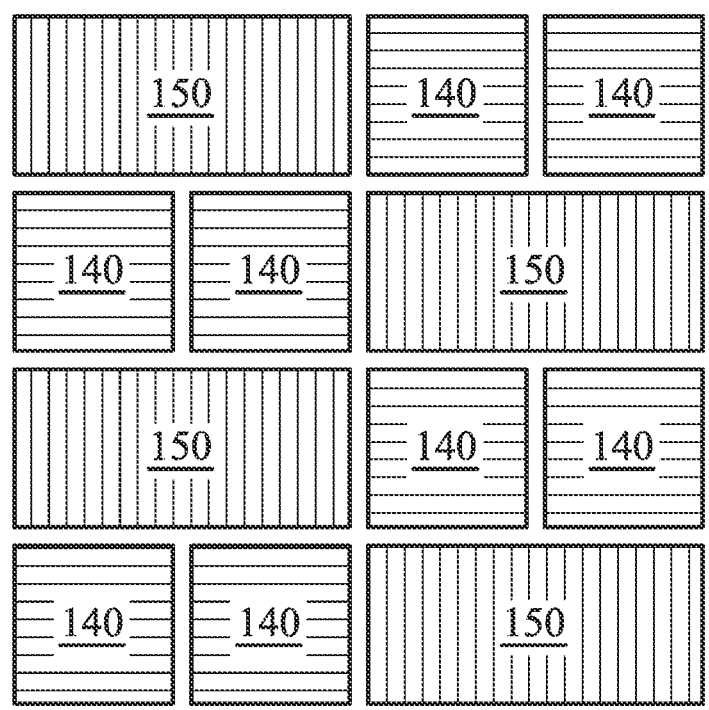
FIG. 3 is a schematic view of a circuit configuration of an electronic device according to an embodiment of the disclosure.
Figure 4:
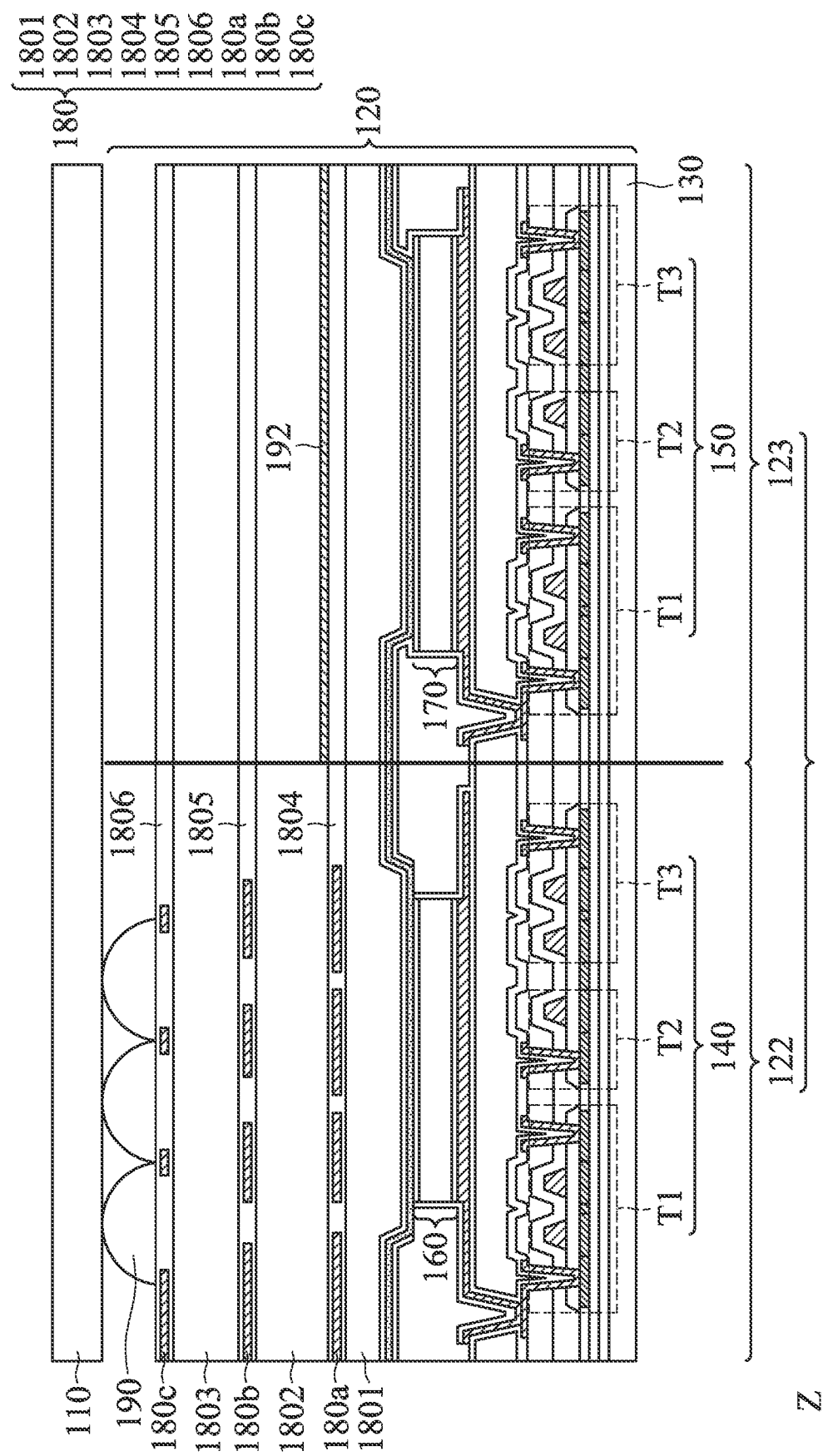
FIG. 4 is a cross-sectional view of a part of an electronic device according to an embodiment of the disclosure.
Figure 5:
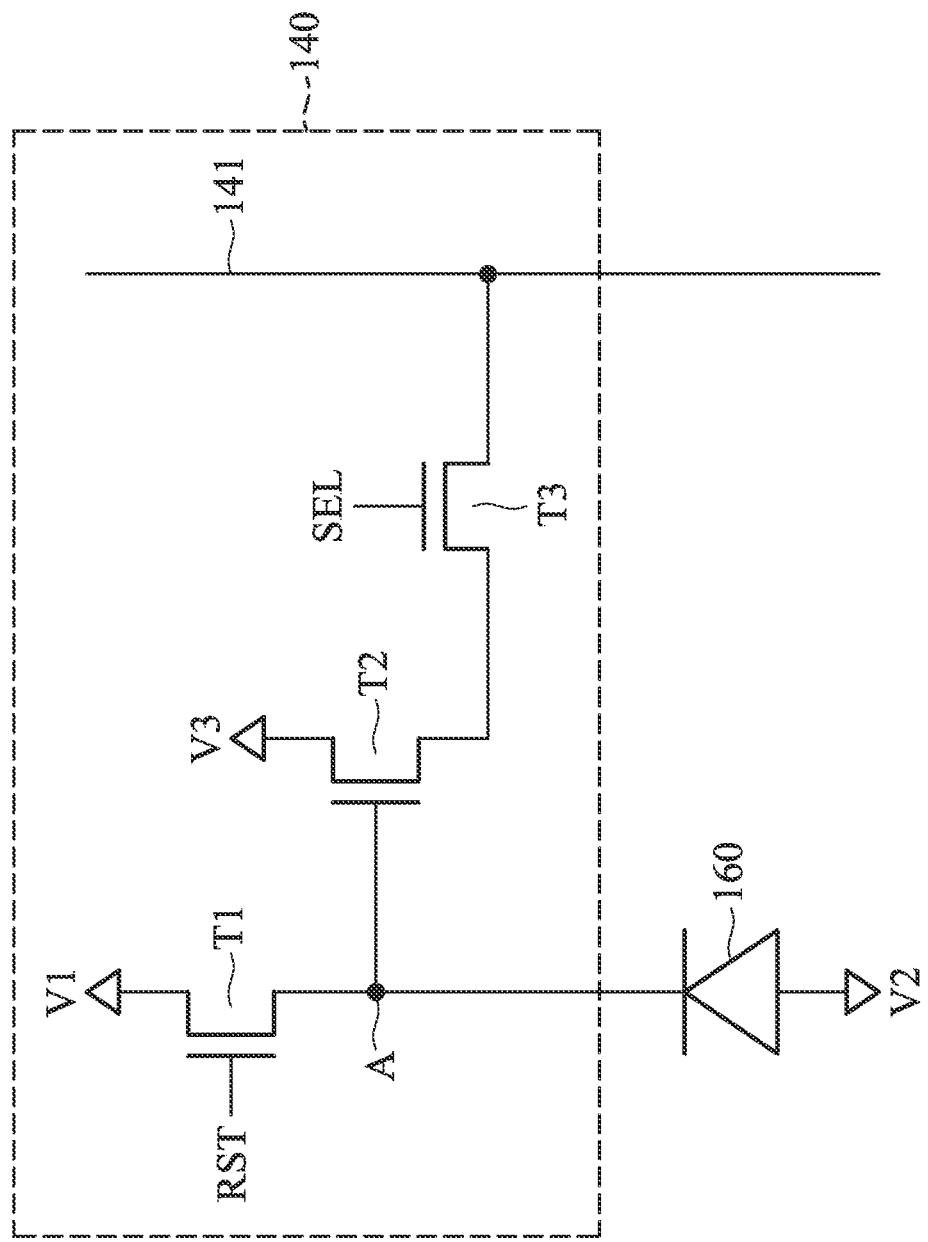
FIG. 5 is a schematic circuit diagram of a circuit and a photodetector in FIG. 4.

FIG. 1 is a perspective view of an electronic device according to an embodiment of the disclosure. FIG. 2 is a top view of an electronic device according to an embodiment of the disclosure. FIG. 3 is a schematic view of a circuit configuration of an electronic device according to an embodiment of the disclosure. FIG. 4 is a cross-sectional view of a part of an electronic device according to an embodiment of the disclosure. FIG. 5 is a schematic circuit diagram of a circuit and a photodetector in FIG. 4. In the embodiment, the electronic device 100 may include a device with the sensing function, but the disclosure is not limited thereto.

In an embodiment, the electronic device may include a display device, a backlight device, an antenna device, a sensing device, a splicing device or a therapeutic diagnosis device, but the disclosure is not limited thereto. The electronic device may be a bendable or flexible electronic device. The display device may be a non-self-luminous type display device or a self-luminous type display device. The antenna device may be a liquid-crystal type antenna device or a non-liquid-crystal type antenna device, and the sensing device may be a sensing device that senses capacitance, light, heat or ultrasound, but the disclosure is not limited thereto. The electronic component may include a passive component and an active component, such as a capacitor, a resistor, an inductor, a diode, a transistor, etc. The diode may include a light-emitting diode or a photodiode. The light-emitting diode may include, for example, an organic light-emitting diode (OLED), a mini LED, a micro LED or a quantum dot LED, but the disclosure is not limited thereto. The splicing device may be, for example, a display splicing device or an antenna splicing device, but the disclosure is not limited thereto. It should be noted that the electronic device may be any arrangement and combination of the above devices, but the disclosure is not limited thereto. Hereinafter, the display device will be used as an electronic device or a splicing device to illustrate to the content of the disclosure, but the disclosure is not limited thereto.

For example, the electronic device 100 may be a device with an identification function of a fingerprint and a living body. Please refer to FIG. 1, FIG. 2, FIG. 3, FIG. 4 and FIG. 5. The electronic device 100 may at least include a display panel 110 and a sensing device 120.

In some embodiment, the electronic device 100 may include the display panel 110, the display panel 110 may include a display area AA and a non-display area PA, the display area AA may be an area on with a display function, and the display area AA includes a display pixel, but the disclosure is not limited thereto. The non-display area PA is adjacent to the display area AA, and the non-display area PA may be an area without a display function. In some embodiments, the display panel 110 may include a rigid substrate or a flexible substrate. For example, the material of the display panel 110 may include glass, quartz, sapphire, ceramics, polycarbonate (PC), polyimide, (PI), polyethylene terephthalate (PET), other suitable materials or a combination thereof, but the disclosure is not limited thereto.

Furthermore, the display panel 110 may include a sensing area 111 and a non-sensing area 116. The sensing area 111 may be an area with a sensing function. For example, the sensing area 111 may be, for example, a region for sensing changes in light to identify the fingerprint (or/and the living body), but the disclosure is not limited thereto. The non-sensing area 116 may be adjacent to the sensing area 111 and may be an area without a sensing function. For example, compared with the sensing area 111, the non-sensing area 116 may not have the function of identifying the fingerprint (or/and the living body). The sensing device 120 is disposed on the side of the display panel 110 (for example, disposed below the display panel 110), and the display panel 120 may be disposed corresponding to the sensing area 111, as shown in FIG. 1. In the embodiment, the sensing device 120 may at least include a substrate 130, a circuit 140, a circuit 150, a photodetector 160 and a photodetector 170.

In some embodiments, the sensing area 111 may overlap with a part of the display area AA in the normal direction of the surface of the display panel 110, and the non-sensing area 116 may overlap with another part of the display area AA in the normal direction of the surface of the display panel 110 (as shown in FIG. 1). In other embodiments, the sensing area 111 and the display area AA may be substantially completely overlapped. Furthermore, it should be noted that the term "corresponding to" used in this specification may mean at least partially overlapping in the normal direction (such as a Z direction) of the surface of the display panel 110.

The substrate 130 may include a sensing region 121 or a sensing region (not shown), as shown in FIG. 1 or FIG. 4, and the sensing region 121 may corresponds to the sensing area 111 of the display panel 110. Furthermore, the sensing region 121 may further include a sub-sensing region 122 and a sub-sensing region 123, but the disclosure is not limited thereto. In some embodiments, the substrate 130 may include a rigid substrate or a flexible substrate. For example, the material of the substrate 130 may include may include glass, quartz, sapphire, ceramics, polycarbonate (PC), polyimide, (PI), polyethylene terephthalate (PET), other suitable materials or a combination thereof, but the disclosure is not limited thereto.

The circuit 140 may be disposed on the substrate 130 and in the sensing region 121, and configured to sense the fingerprint. That is, the circuit 140 may sense the fingerprint of the object touching the sensing region 121 of the display panel 110. Furthermore, the circuit 140 may be disposed in a sub-sensing region 122 of the sensing region 121. That is, the sub-sensing region 122 may be a fingerprint sensing region.

The circuit 150 may be disposed on the substrate 130 and in the sensing region 121, and configured to identify the living body. The circuit 150 may perform a living body identification on the object touching on the sensing region 121 of the display panel 110 to identify whether the object is a living body. Furthermore, the circuit 150 may be disposed in the sub-sensing region 123 of the sensing region 121. That is, the sub-sensing region 123 may be a living body sensing region.

The photodetector 160 or the photodetector 170 may include a photodiode, a phototransistor, a metal-semiconductor-metal photodetector (MSM photodetector) or any suitable photodetector, but the disclosure is not limited thereto. In order to explain the disclosure clearly, the photodetector 160 of the embodiment is illustrated by taking a photodiode as an example. The photodetector 160 may be electrically connected to the circuit 140. The photodetector 170 may be electrically connected to the circuit 150. In the embodiment, the area of the photodetector 170 may be larger than the area of the photodetector 160, as shown in FIG. 3. In some embodiments, the ratio of the area of the photodetector 170 and the area of the photodetector 160 is between 1 and 40 (1≤area ratio≤40), such as 1.3, 1.8, 10, 20, 30, but the disclosure is not limited thereto. That is, by increasing the area of the photodetector 170, the magnitude of the photocurrent signal may be increased, so as to increase the accuracy that the circuit 150 identifies the living body.

In some embodiments, the area of the photodetector (such as the photodetector 160 or the photodetector 170) may be defined as the area enclosed by the outline of the photodetector. For example, the area of the photodetector may be the area of a light-receiving surface of the photodetector, but the disclosure is not limited thereto. In some embodiments, if the surface of the photodetector (such as the photodetector 160 or the photodetector 170) is not fully exposed, the area may not be measured using the above definitions. Therefore, a width may be taken from any section on the photodetector in a first direction (such as a X direction) parallel to the extending direction of the scanning line, and a length may be taken from any section on the photodetector in a second direction (such as a Y direction) perpendicular to the extending direction of the scanning line. Then, a product of the above length and the above width may be regarded as the area of the photodetector (such as the photodetector 160 or the photodetector 170). It should be noted that if it needs to compare the areas of two different photodetectors, the lengths and the widths of the corresponding positions of the two photodetectors are taken, respectively, and then the products of the lengths and the widths are calculated to obtain the areas. For example, in order to compare the areas of the two different photodetectors, a point on one photodetector may be taken, a width may be taken under the section of the first direction (such as the X direction) that is substantially parallel to the extending direction of the scanning line, and a width may be taken under the section in the same direction at the corresponding position of the other photodetector. Similarly, a point may be taken on one photodetector, a length may be taken under the section of the second direction (such as the Y direction) that is substantially parallel to the extending direction of the data line, and a length may be taken under may be taken under the section in the same direction at the corresponding position of the other photodetector, but the disclosure is not limited thereto.

As shown in FIG. 4, in the sub-sensing region 122, the sensing device 120 may further include a light collimation layer 180 and a microlens array layer 190. In the sub-sensing region 122, the circuit 140 may be disposed on the substrate 130. The photodetector 160 may be disposed on the circuit 140. The light collimation layer 180 may be disposed on the photodetector 160. The microlens array layer 190 may be disposed on the light collimation layer 180. The display panel 110 may be disposed on the microlens array layer 190. In the embodiment, the light collimation layer 180 is used to reduce the crosstalk phenomenon of light. In addition, the microlens array layer 190 is used to increase the angle of receiving the incident light and condense the incident light, so as to increase the magnitude of the photocurrent signal of the unit pixel. In some embodiments, the microlens array layer 190 may include at least one microlens, but the disclosure is not limited thereto.

In addition, as shown in FIG. 4, in the sub-sensing region 123, the sensing device 120 further includes a wavelength selective layer 192. In the sub-sensing region 123, the circuit 150 may be disposed on the substrate 130. The photodetector 170 may be disposed on the circuit 150. In other embodiments, in the sub-sensing region 123, the sensing device 120 may further include a light collimation layer 180, and the light collimation layer 180 may be disposed on the photodetector 170 (not shown). The wavelength selective layer 192 may be disposed on the photodetector 170 and located in the light collimation layer 180 (not shown). In addition, in other embodiments, a filling layer (not shown) may be disposed between the light collimation layer 180 and the display panel 110, and a part of the filling layer may be disposed between two adjacent microlenses, so as to reduce the influence on the reception of the incident light. In some embodiments, the above filling layer is, for example, a transparent material, but the disclosure is not limited thereto.

In some embodiments, the light collimation layer 180 may include a plurality of insulating layers (1801, 1802 and 1803), a plurality of inorganic layers (1804, 1805 and 1806), a first light shielding layer 180a, a second light shielding layer 180b and a third light shielding layer 180c. The first light shielding layer 180a is disposed adjacent to the photodetector 160. The third light shielding layer 180c is disposed adjacent to the display panel 110. The second light shielding layer 180b is disposed between the first light shielding layer 180a and the third light shielding layer 180c. The light shielding layers (180a, 180b and 180c) may be disposed in the inorganic layers (1804, 1805 and 1806). In other words, part of the inorganic layers (1804, 1805 and 1806) may be disposed between the light shielding layers (180a, 180b and 180c) and the insulating layers (1801, 1802 and 1803). Furthermore, the first light shielding layer 180a, the second light shielding layer 180b and the third light shielding layer 180c include openings, the part of the inorganic layers (1804, 1805 and 1806) may be disposed in the openings. The openings of the first light shielding layer 180a, the second light shielding layer 180b and the third light shielding layer 180c are disposed corresponding to the microlenses of the microlens layer 190, the width of the opening of the first light shielding layer 180a is smaller than the width of the opening of the second light shielding layer 180b, and the width of the opening of the second light shielding layer 180b is smaller than the width of the opening of the third light shielding layer 180c, but the disclosure is not limited thereto. The closer to the photodetector 160, the smaller the widths of openings of the light shielding layers (180a, 180b and 180c), which may concentrate the incident light or reduce the phenomenon of light crosstalk.

In some embodiments, the materials of the insulating layers (1801, 1802 and 1803) may include, for example, organic materials or inorganic materials, but the disclosure is not limited thereto. The materials of the inorganic layers (1804, 1805 and 1806) may include, for example, silicon oxide (SiOx), silicon nitride (SiNx), other suitable materials, or a combination thereof, but the disclosure is not limited thereto. The materials of the light shielding layers (180a, 180b and 180c) may include metal, for example, or another suitable light shielding material, but the disclosure is not limited thereto.

Furthermore, in some embodiments, the wavelength selective layer 192 is, for example, a red color filter layer, but the disclosure is not limited thereto. That is, the wavelength selective layer 192 may perform a light filtering process on the incident light, so that the red light may pass through the wavelength selective layer 192 and the wavelength selective layer 192 may pass the red light to the photodetector 170. In addition, the wavelength range of the above red light is, for example, between 600 nanometers (nm) and 700 nanometers (600 nm≤the wavelength≤700 nm), such as 650 nm, 660 nm, 670 nm, but the disclosure is not limited thereto.

In some embodiments, the wavelength selective layer 192 is, for example, a Bragg reflector layer, but the disclosure is not limited thereto. Furthermore, the Bragg reflector layer may be formed of a multilayer film, and may be a superposition of organic materials and the inorganic materials. Therefore, the Bragg reflector layer may also perform the light filtering process on the incident light, so that the light with a specific wavelength may pass through the Bragg reflector layer. In addition, the light with the specific wavelength is, for example, the red light, and the wavelength range of the above red light is for example, between 600 nm and 700 nm (600 nm≤the wavelength≤00 nm), such as 650 nm, 660 nm, 670 nm, but the disclosure is not limited thereto. Therefore, by combining the circuit 150, the photodetector 170 and the wavelength selective layer 192, the oxyhemoglobin of the object may be detected, to as to achieve the effect of biometric fingerprint identification, and then perform substantial living body identification.

In addition, the sensing device 120 may further adjust the energy gap of the photodetector 170 by changing the material of the photodetector or adjusting the process parameters, so as to change the photoelectric characteristics of the photodetector 170. Therefore, the photodetector 170 may effectively absorb the light generated by the wavelength selective layer 192, so as to increase the effect of the living body identification.

In the embodiment, a light source may be provided through the display panel 110, so that the sensing device 120 may perform the fingerprint sensing and the living body identification. For example, in some embodiments, when an object touches the display panel 110, the display panel 110 may firstly provide the light source, and the light source is not limited, for example, the light source may be blue light, green light, red light, white light, etc. The light emitted by the light source may be reflected through the object into the sensing region 122 and the sensing region 123 of the sensing device 120 and transmitted to the photodetector 160 and the photodetector 170, so that the circuit 140 may perform the fingerprint sensing on the object and the circuit 150 may detect the oxyhemoglobin of the object to perform the living body identification on the object.

In the embodiment shown in FIG. 2, the density of circuit 150 in the sensing region 121 may be lower than the density of circuit 140 in the sensing region 121, and the number of circuits 140 and of circuits 150 is used to define the density, but the disclosure is not limited thereto. For example, a plurality of scan lines SL and a plurality of data lines DL are interleaved to form an array. In the area of the 2×2 array, there is one circuit 150 and two circuits 140, and thus the density of circuit 150 is lower than the density of circuit 140. In addition, in the area of the 3×3 array, there are three circuits 150 and four circuits 140, and thus the density of circuit 150 is lower than the density of circuit 140. Furthermore, in the area of the 4×4 array, there are four circuits 150 and eight circuits 140, and thus the density of circuit 150 is lower than the density of circuit 140. The manner in which the areas of rest of the arrays are determined may follow similar rules.

In the embodiment shown in FIG. 5, the circuit 140 may include a thin film transistor T1, a thin film transistor T2, and a thin film transistor T3. The photodetector 160 is electrically connected to the circuit 140. The thin film transistor referred to herein may include a switching transistor, a driving transistor, a reset transistor, a transistor amplifier, or another suitable thin film transistor to form the circuit 140. Specifically, according to some embodiments, the thin film transistor T1 may be the reset transistor, the thin film transistor T2 may be the transistor amplifier, the thin film transistor T3 may be the switching transistor, but the disclosure is not limited thereto.

In detail, the circuit 140 may include a signal line coupled to the thin film transistor, for example, may include a current signal line, voltage signal line, a high-frequency signal line, and a low-frequency signal line, and the signal line may transmit the element working voltage (VDD), the ground terminal voltage (VS S), or the driving element terminal voltage, but the disclosure is not limited thereto.

The thin film transistor T1 may include a gate terminal, a first terminal, and a second terminal. The gate terminal of the thin film transistor T1 receives a reset signal RST. The first terminal of the thin film transistor T1 receives a voltage V1. In the embodiment, the thin film transistor T1 may be an N-type thin film transistor, and the first terminal and the second terminal of the thin film transistor T1 may be, for example, a drain terminal and a source terminal, but the disclosure is not limited thereto. In some embodiments, the thin film transistor T1 may also be a P-type thin film transistor, but the disclosure is not limited thereto. In addition, in the embodiment, the voltage V1 is, for example, a system voltage, but the disclosure is not limited thereto.

The photodetector 160 includes a first terminal and a second terminal. The first terminal of the photodetector 160 is electrically connected to the second terminal of the thin film transistor T1, so as to form, for example, a node A. The second terminal of the photodetector 160 receives a voltage V2. In some embodiments, the first terminal of the photodetector 160 is, for example, a cathode terminal, and the second terminal of the photodetector 160 is, for example, an anode terminal, but the disclosure is not limited thereto. In addition, the voltage V2 is, for example, a ground voltage, but the disclosure is not limited thereto.

The thin film transistor T2 may include a gate terminal, a first terminal and a second terminal. The gate terminal of the thin film transistor T2 is electrically connected to the second terminal of the thin film transistor T1. The first terminal of the thin film transistor T2 receives a voltage V3. In the embodiment, the thin film transistor T2 may be an N-type thin film transistor, and the first terminal and the second terminal of the thin film transistor T2 may be, for example, a drain terminal and a source terminal, but the disclosure is not limited thereto. In some embodiments, the thin film transistor T2 may also be a P-type thin film transistor, but the disclosure is not limited thereto. According to some embodiments, the thin film transistor T2 is used to perform a signal amplifying on the voltage of the node A to generate an amplified current. In addition, in the embodiment, the voltage V3 is, for example, the system voltage, but the disclosure is not limited thereto. Furthermore, the thin film transistor T2 may be used as a source follower, but disclosure is not limited thereto.

The thin film transistor T3 may include a gate terminal, a first terminal and a second terminal. The gate terminal of the thin film transistor T3 receives a selecting signal SEL. The first terminal of the thin film transistor T3 is electrically connected to the second terminal of the thin film transistor T2. The second terminal of the thin film transistor T3 is electrically connected to the conductive line 141. In the embodiment, the thin film transistor T3 may be an N-type thin film transistor, and the first terminal and the second terminal of the thin film transistor T3 may be, for example, a drain terminal and a source terminal, but the disclosure is not limited thereto. In some embodiments, the thin film transistor T3 may also be a P-type thin film transistor, but the disclosure is not limited thereto. When the thin film transistor T3 is turned on, the first terminal of the thin film transistor T3 is connected to the conductive line 141, and the amplified current may output to the conductive line 141. When the thin film transistor T3 is turned off, the first terminal of the thin film transistor T3 is disconnected from the conductive line 141, and the amplified current may not output to the conductive line 141.

In addition, the circuit 150 is the same as or similar to the circuit 140, the circuit 150 may also include a thin film transistor T1, a thin film transistor T2 and a thin film transistor T3, and the photodetector 170 is also the same as or similar to the photodetector 160, as shown in FIG. 5. Accordingly, the connection relationship of the thin film transistor T1, the thin film transistor T2 and the thin film transistor T3 of the circuit 150 and the photodetector 170 may also refer to description of the embodiment of FIG. 5, and the description thereof is not repeated herein.

Figure 6:
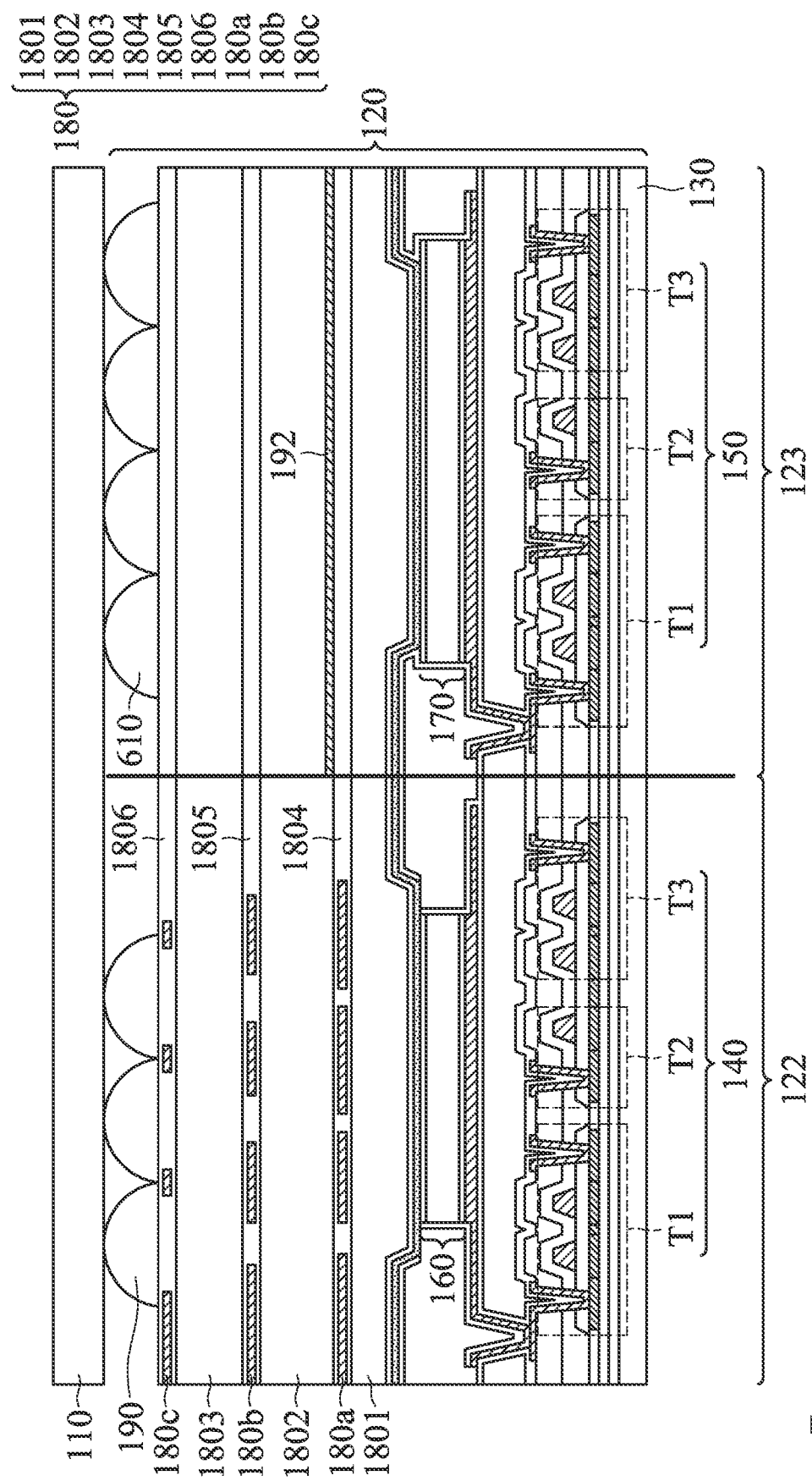
FIG. 6 is a cross-sectional view of a part of an electronic device according to another embodiment of the disclosure.

FIG. 6 is a cross-sectional view of a part of an electronic device according to another embodiment of the disclosure. The embodiment of FIG. 6 is substantially similar to the embodiment of FIG. 4. The elements or the components of FIG. 6 the same as or similar to FIG. 4 may refer to the embodiment of FIG. 4, and the description thereof is not repeated herein. In FIG. 6, the sensing device 120 may further include a microlens array layer 610, and the microlens array layer 610 may be disposed on the photodetector 170. Furthermore, as shown in FIG. 6, the microlens array layer 610 is disposed on the wavelength selective layer 192, and located between the wavelength selective layer 192 and the display panel 110. In addition, the microlens array layer 610 is the same as or similar to the microlens array layer 190 of FIG. 4. Accordingly, the microlens array layer 610 may refer to the description of the embodiment of FIG. 4, and the description thereof is not repeated herein.

Figure 7:
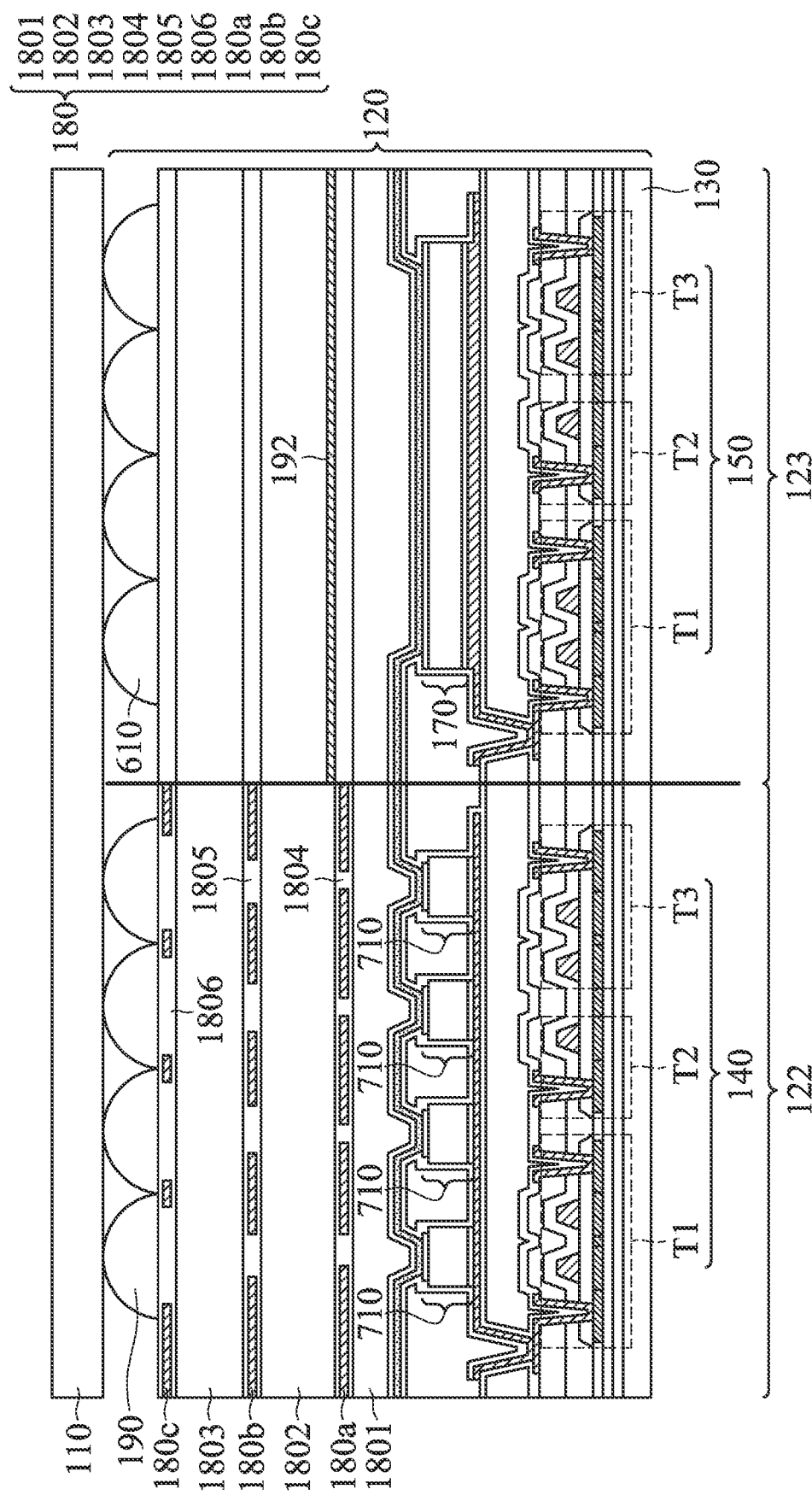
FIG. 7 is a cross-sectional view of a part of an electronic device according to another embodiment of the disclosure.
Figure 8:
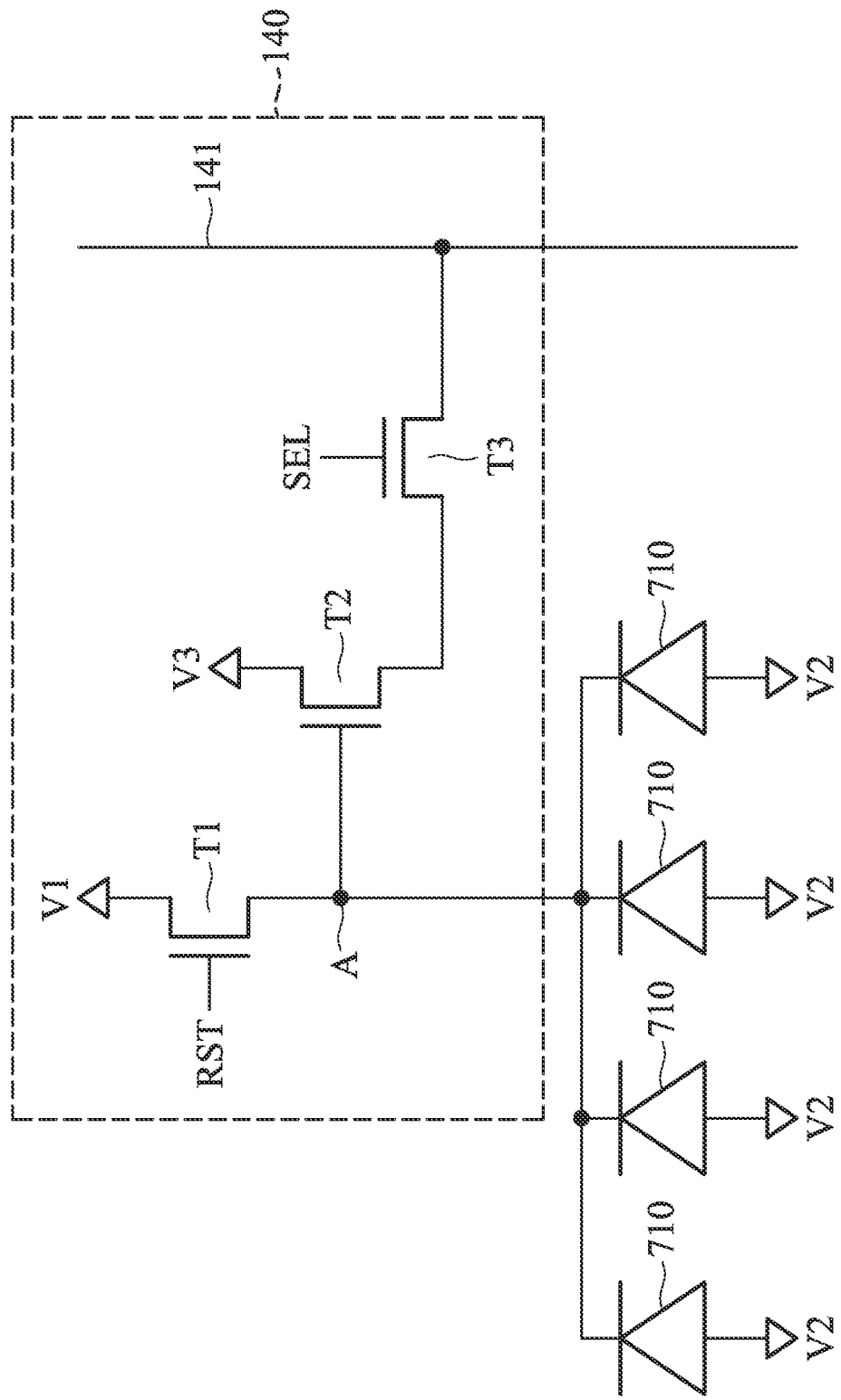
FIG. 8 is a schematic circuit diagram of a circuit and a photodetector in FIG. 7.

FIG. 7 is a cross-sectional view of a part of an electronic device according to another embodiment of the disclosure. The embodiment of FIG. 7 is substantially similar to the embodiment of FIG. 6. The elements or the components of FIG. 7 the same as or similar to FIG. 6 may refer to the embodiment of FIG. 6, and the description thereof is not repeated herein. In FIG. 7, the photodetector 160 may include a plurality of sub-photodetectors 710, i.e., the photodetector 160 is divided into the sub-photodetectors 710. The sub-photodetectors 710 are connected in parallel, and are electrically connected to the circuit 140, as shown in FIG. 8. Furthermore, each of the sub-photodetectors 710 has a first terminal and a second terminal. The first terminal of the sub-photodetector 710 is electrical connected to the second terminal of the thin film transistor T1, so as to form, for example, the node A. The second terminal of the sub-photodetector 710 receives the voltage V2. In addition, the embodiment of FIG. 8 is the same as or similar to the embodiment of FIG. 5. Accordingly, the embodiment of FIG. 8 may refer to the description of the embodiment of FIG. 5, and the description thereof is not repeated herein.

In some embodiments, the number of sub-photodetectors 710 may be consistent with the number of microlenses of the microlens array layer 190, but the disclosure is not limited thereto. For example, when the number of microlenses of the microlens array layer 190 is four, the number of sub-photodetectors 710 is four. When the number of microlenses of the microlens array layer 190 is two, the number of sub-photodetectors 710 is two. When the number of microlenses of the microlens array layer 190 is five, the number of sub-photodetectors 710 is five. The relationship of the rest of the number of microlenses of the microlens array layer 190 and the rest of the number of sub-photodetectors 710 may follow similar rules.

In addition, in the embodiment, the areas of the sub-photodetectors 710 are small, which may reduce the parasitic capacitances generated by the sub-photodetectors 710, so as to increase the conversion gain of the signal or the conversion efficiency of the signal, and then increase the accuracy of the fingerprint sensing.

Figure 9:
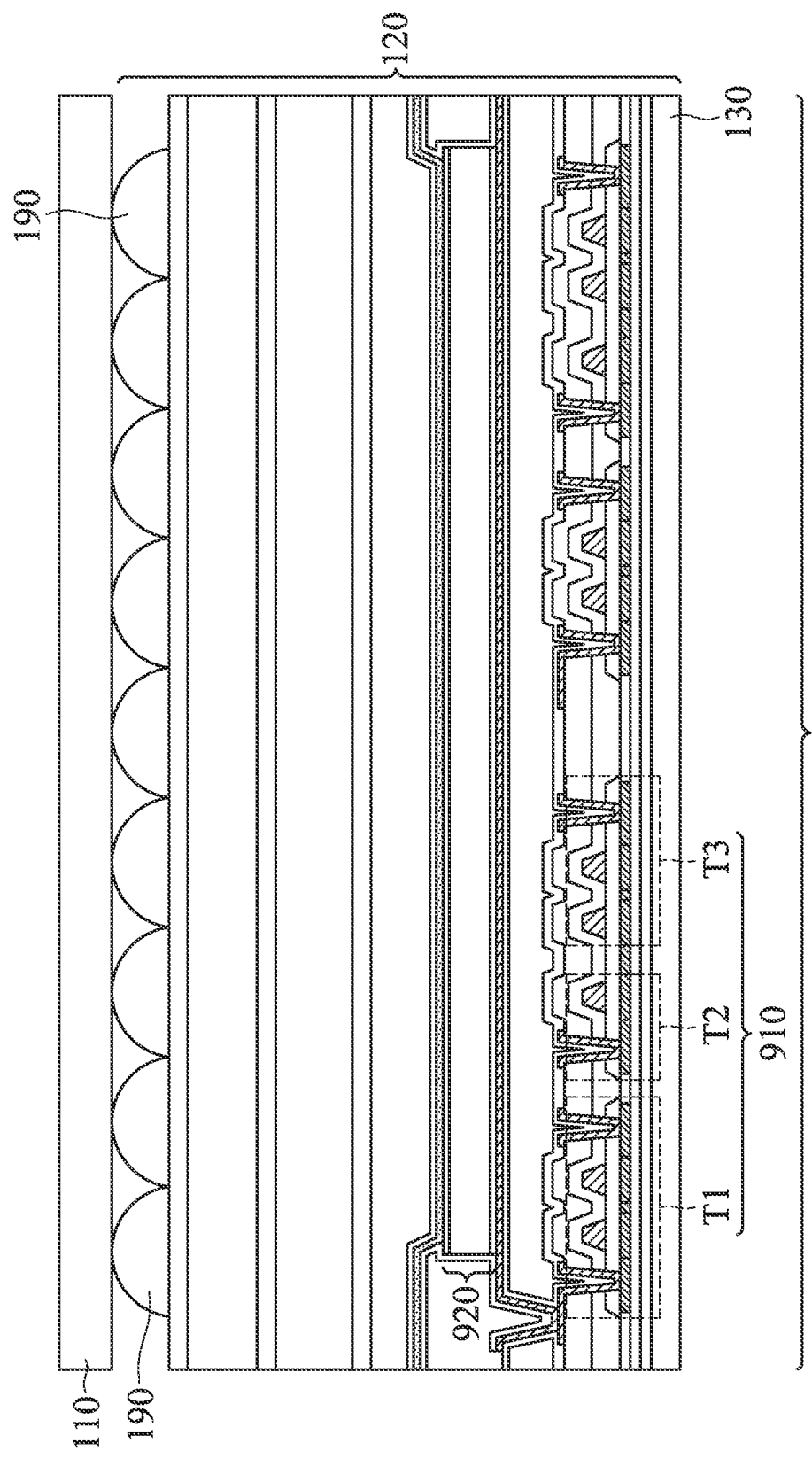
FIG. 9 is a cross-sectional view of a portion of an electronic device according to another embodiment of the disclosure.

FIG. 9 is a cross-sectional view of a portion of an electronic device according to another embodiment of the disclosure. In the embodiment, the sensing device 120 may include a substrate 130, a circuit 910, a photodetector 920 and a microlens array layer 190.

The substrate 130 may include a sensing region 121. The circuit 910 is disposed on the sensing region 121 of the substrate 130 and configured to sense the fingerprint or identify the living body. The photodetector 1020 is disposed on the circuit 910, and electrically connected to the circuit 910. A plurality of insulating layers may be disposed between the photodetector 1020 and the microlens array layer 190, and the display panel 110 is disposed on the microlens array layer 190.

In the embodiment of FIG. 9, the first light source and the second light source may be provided through the display panel 110, so that the sensing device 120 may respectively perform the fingerprint sensing and the living body identification. For example, in some embodiments, when an object touches the display panel 110, the display panel 110 may firstly provide the first light source, and the first light source is not limited, for example, the first light source may be blue light, green light, red light, white light, etc. The first light source may be reflected through the object into the sensing device 120 and transmitted to the photodetector 920, so that the circuit 910 may perform the fingerprint sensing on the object. Then, the display panel 110 may provide the second light source, wherein the second light source is, for example, the red light. The second light source may be reflected through the object into the sensing device 120 and transmitted to the photodetector 920, so that the circuit 910 may detect toe oxyhemoglobin of the object to perform the living body identification on the object.

In some embodiments, when an object touches the display panel 110, the display panel 110 may firstly provide the second light source, wherein the second light source is, for example, the red light. The second light source may be reflected through the object into the sensing device 120 and transmitted to the photodetector 920, so that the circuit 910 may detect toe oxyhemoglobin of the object to perform the living body identification on the object. Then, the display panel 110 may provide the first light source, and the first light source is not limited, for example, the first light source may be blue light, green light, red light, white light, etc. The first light source may be reflected through the object into the sensing device 120 and transmitted to the photodetector 920, so that the circuit 910 may perform the fingerprint sensing on the object.

In addition, the circuit 910 is the same as or similar to the circuit 140, the circuit 910 may also include a thin film transistor T1, a thin film transistor T2 and a thin film transistor T3, and the photodetector 920 is also the same as or similar to the photodetector 160. Accordingly, the connection relationship of the thin film transistor T1, the thin film transistor T2 and the thin film transistor T3 of the circuit 910 and the photodetector 920 may also refer to description of the embodiment of FIG. 5, and the description thereof is not repeated herein.

Figure 10:
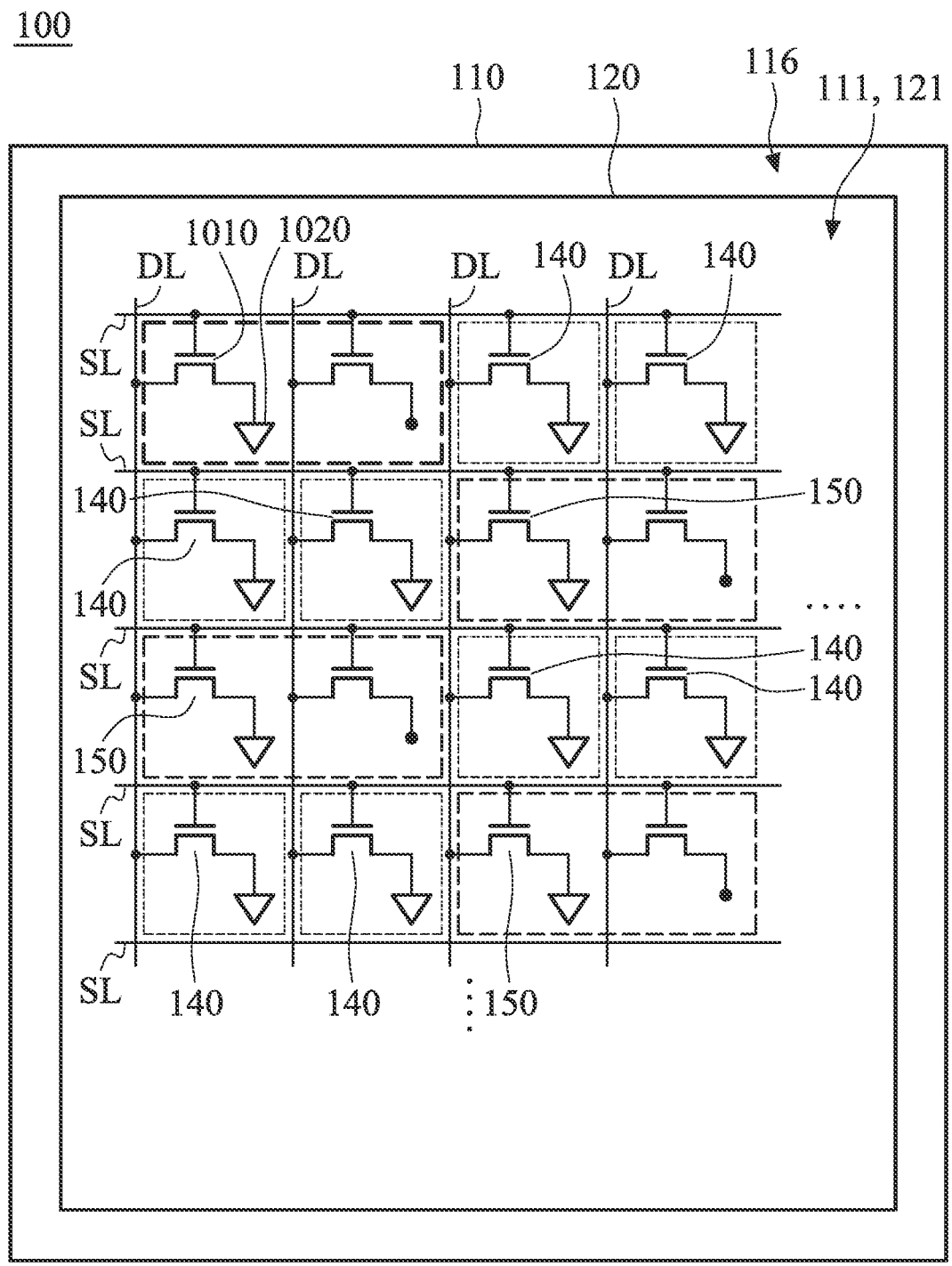
FIG. 10 is a top view of an electronic device according to another embodiment of the disclosure.
Figure 11:
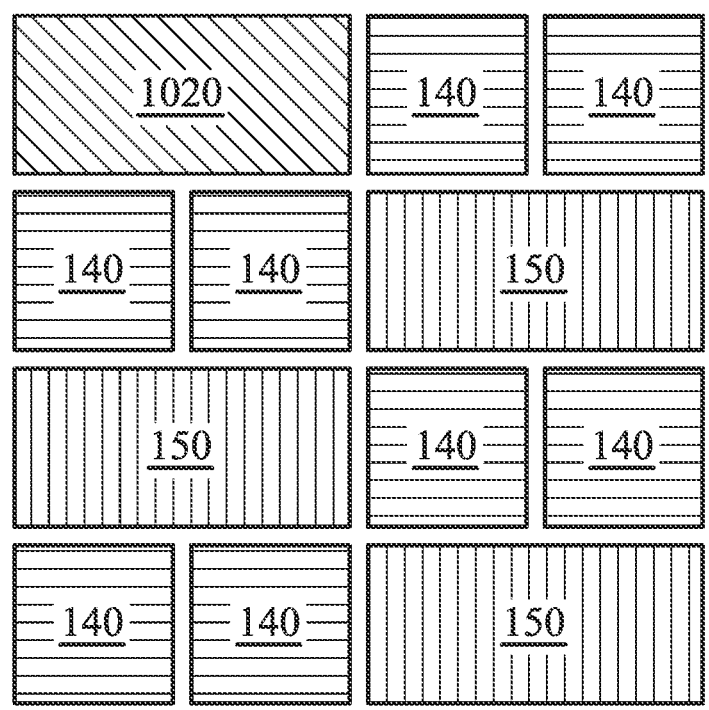
FIG. 11 is a schematic view of a circuit configuration of an electronic device according to another embodiment of the disclosure.

FIG. 10 is a top view of an electronic device according to another embodiment of the disclosure. FIG. 11 is a schematic view of a circuit configuration of an electronic device according to another embodiment of the disclosure. The embodiments of FIG. 10 and FIG. 11 are substantially similar to the embodiments of FIG. 2 and FIG. 3. The elements or the components of FIG. 10 and FIG. 11 the same as or similar to FIG. 2 and FIG. 3 may refer to the embodiments of FIG. 2 and FIG. 3, and the description thereof is not repeated herein.

In the embodiment, the electronic device 100 further includes a circuit 1010 and a photodetector 1020. The circuit 1010 is disposed on a substrate (such as the substrate 130 of FIG. 4), and configured to sense ambient light. The photodetector 1020 is electrically connected to the circuit 1010. In addition, the manner in which the circuit 1010 and the photodetector 1020 are disposed on the substrate may be the same as or similar to the manner in which the circuit 140 and the photodetector 160 are disposed on the substrate 130. Accordingly, the manner in which the circuit 1010 and the photodetector 1020 are disposed on the substrate may refer to the embodiment of FIG. 4, and the description thereof is not repeated herein.

In some embodiment, the area of the photodetector 1020 is larger than the area of the photodetector 160, as shown in FIG. 11. That is, by increasing the area of the photodetector 1020, the magnitude of the photocurrent signal may be increased, so a so increase the accuracy that the circuit 1010 senses the ambient light. Therefore, the ambient light may be sensed by the circuit 1010, so that the electronic device 100 may distinguish the ambient light or exclude the ambient light when sensing the fingerprint or identifying the living body, so as to increase the accuracy of sensing the fingerprint or identifying the living body.

It should be noted that there may be no wavelength selective layer between the photodetector 1020 and the display panel 110.

In addition, the circuit 1010 is the same as or similar to the circuit 140, the circuit 1010 may also include a thin film transistor T1, a thin film transistor T2 and a thin film transistor T3, and the photodetector 1020 is also the same as or similar to the photodetector 160. Accordingly, the connection relationship of the thin film transistor T1, the thin film transistor T2 and the thin film transistor T3 of the circuit 1010 and the photodetector 1020 may also refer to description of the embodiment of FIG. 5, and the description thereof is not repeated herein. Furthermore, in the embodiment, the disposing positions of the circuit 1010 and the photodetector 1020 is an exemplary embodiment of the disclosure. In some embodiments, the circuit 1010 and the photodetector 1020 may be disposed on other position in the sensing region, and the same effect may also be achieved.

In summary, according to the sensing device and the electronic device disclosed by the embodiments of the disclosure, the first circuit is disposed on the substrate and in the sensing region, and senses the fingerprint. The second circuit is disposed on the substrate and in the sensing region, and senses the living body. The first photodetector is electrically connected to the first circuit. The second photodetector is electrically connected to the second circuit. The area of the second photodetector is larger than the area of the first photodetector. Therefore, the disclosure may have the effect of fingerprint and living body identification, increase the accuracy of the living body identification, or perform living body anti-counterfeiting identification.

While the disclosure has been described by way of examples and in terms of the preferred embodiments, it should be understood that the disclosure is not limited to the disclosed embodiments. On the contrary, it is intended to cover various modifications, combinations, and similar arrangements (as would be apparent to those skilled in the art). Therefore, the scope of the appended claims should be accorded the broadest interpretation to encompass all such modifications, combinations, and similar arrangements.

What is claimed is:

1. A sensing device, comprising:
   a substrate, having a sensing region;
   a first circuit, disposed on the substrate and in the sensing region, and configured to sense a fingerprint;
   a second circuit, disposed on the substrate and in the sensing region, and configured to sense a living body;
   a first photodetector, electrically connected to the first circuit; and
   a second photodetector, electrically connected to the second circuit;
   wherein an area of the second photodetector is larger than an area of the first photodetector.

2. The electronic device according to claim 1, wherein a ratio of the area of the second photodetector to the area of the first photodetector is between 1 and 40.

3. The electronic device according to claim 1, further comprising a wavelength selective layer disposed on the second photodetector.

4. The electronic device according to claim 3, wherein the wavelength selective layer is a red filter layer.

5. The electronic device according to claim 3, wherein the wavelength selective layer is a Bragg reflector layer.

6. The electronic device according to claim 1, further comprising a microlens array layer disposed on the second photodetector.

7. The electronic device according to claim 1, wherein a density of the second circuit in the sensing region is lower than a density of the first circuit in the sensing region.

8. The electronic device according to claim 1, further comprising:
   a third circuit, disposed on the substrate, and configured to sense ambient light; and
   a third photodetector, electrically connected to the third circuit.

9. The electronic device according to claim 8, wherein an area of the third photodetector is larger than the area of the first photodetector.

10. The electronic device according to claim 1, wherein the first photodetector comprises a plurality of sub-photodetectors, and the plurality of sub-photodetectors are connected in parallel.

11. An electronic device, comprising:
   a display panel; and
   a sensing device, disposed on a side of the display panel, wherein the sensing device comprises:
   a substrate, having a sensing region;
   a first circuit, disposed on the substrate and in the sensing region, and configured to sense a fingerprint;
   a second circuit, disposed on the substrate and in the sensing region, and configured to sense a living body;
   a first photodetector, electrically connected to the first circuit; and
   a second photodetector, electrically connected to the second circuit;
   wherein an area of the second photodetector is larger than an area of the first photodetector.

12. The electronic device according to claim 11, wherein a ratio of the area of the second photodetector to the area of the first photodetector is between 1 and 40.

13. The electronic device according to claim 11, wherein the sensing device further comprises a wavelength selective layer disposed on the second photodetector.

14. The electronic device according to claim 13, wherein the wavelength selective layer is a red filter layer.

15. The electronic device according to claim 13, wherein the wavelength selective layer is a Bragg reflector layer.

16. The electronic device according to claim 11, wherein the sensing device further comprises a microlens array layer disposed on the second photodetector.

17. The electronic device according to claim 11, wherein a density of the second circuit in the sensing region is lower than a density of the first circuit in the sensing region.

18. The electronic device according to claim 11, wherein the sensing device further comprises:
   a third circuit, disposed on the substrate, and configured to sense ambient light; and
   a third photodetector, electrically connected to the third circuit.

19. The electronic device according to claim 18, wherein an area of the third photodetector is larger than the area of the first photodetector.

20. The electronic device according to claim 11, wherein the first photodetector comprises a plurality of sub-photodetectors, and the plurality of sub-photodetectors are connected in parallel.

* * * * *